United States Patent
Bae et al.

(10) Patent No.: US 12,264,075 B2
(45) Date of Patent: Apr. 1, 2025

(54) COMPOSITION FOR FORMING SILICA LAYER AND SILICA LAYER

(71) Applicant: Samsung SDI Co., Ltd., Yongin-si (KR)

(72) Inventors: Jin-Hee Bae, Suwon-si (KR); Taeksoo Kwak, Suwon-si (KR); Myungho Kang, Suwon-si (KR); Seungwoo Jang, Suwon-si (KR); Kunbae Noh, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1250 days.

(21) Appl. No.: 16/987,981

(22) Filed: Aug. 7, 2020

(65) Prior Publication Data

US 2021/0053832 A1 Feb. 25, 2021

(30) Foreign Application Priority Data

Aug. 21, 2019 (KR) .................. 10-2019-0102596

(51) Int. Cl.
| | | |
|---|---|---|
| *C01B 33/12* | (2006.01) | |
| *C09D 1/00* | (2006.01) | |
| *C09D 7/20* | (2018.01) | |
| *C23C 18/12* | (2006.01) | |
| *H01L 27/12* | (2006.01) | |

(52) U.S. Cl.
CPC ............. *C01B 33/126* (2013.01); *C09D 1/00* (2013.01); *C09D 7/20* (2018.01); *C23C 18/122* (2013.01); *H01L 27/1248* (2013.01)

(58) Field of Classification Search
CPC .................................................. C01B 33/126
See application file for complete search history.

(56) References Cited

U.S. PATENT DOCUMENTS

| | | | |
|---|---|---|---|
| 5,322,913 A | 6/1994 | Blum et al. | |
| 2011/0129981 A1* | 6/2011 | Lim ................. | H01L 21/02216 |
| | | | 524/588 |
| 2014/0187017 A1* | 7/2014 | Bae ....................... | C08G 77/00 |
| | | | 438/381 |

FOREIGN PATENT DOCUMENTS

| | | |
|---|---|---|
| CN | 102137710 A | 7/2011 |
| CN | 103910885 A | 7/2014 |
| CN | 105264042 A | 1/2016 |

(Continued)

OTHER PUBLICATIONS

Communication dated Oct. 20, 2021 issued by the Korean Patent Office in application No. 10-2019-0102596.

(Continued)

*Primary Examiner* — Peter F Godenschwager
(74) *Attorney, Agent, or Firm* — Sughrue Mion, PLLC

(57) ABSTRACT

Provided are a composition for forming a silica layer including a silicon-containing polymer and a solvent, wherein when adding 70 g of the composition for forming the silica layer to a 100 ml container, leaving it at 40° C. for 28 days, and taking 1 ml of gas generated from the composition, 1 ml of the gas includes hydrogen gas ($H_2$), silane gas ($SiH_4$), and ammonia gas ($NH_3$), and the hydrogen gas, silane gas, and ammonia gas satisfy Equation 1: [(hydrogen gas amount (Continued)

(ppm))/(silane gas amount (ppm)+ammonia gas amount (ppm))≥1.5], a silica layer manufactured therefrom, and an electronic device including the silica layer.

16 Claims, 3 Drawing Sheets

(56) References Cited

FOREIGN PATENT DOCUMENTS

| CN | 105793963 A | 7/2016 |
|---|---|---|
| CN | 106147604 A | 11/2016 |
| CN | 106558483 A | 4/2017 |
| CN | 109957261 A | 7/2019 |
| JP | 11-87332 A | 3/1999 |
| JP | 2001-308090 A | 11/2001 |
| JP | 2003-197611 A | 7/2003 |
| JP | 2006-54353 A | 2/2006 |
| JP | 200888224 A | 4/2008 |
| JP | 2013-1721 A | 1/2013 |
| JP | 2015-117138 A | 6/2015 |
| JP | 2016-117881 A | 6/2016 |
| JP | 2016-216341 A | 12/2016 |
| JP | 2017-31040 A | 2/2017 |
| JP | 2017-63178 A | 3/2017 |
| JP | 2018-37641 A | 3/2018 |
| KR | 10-2006-0034903 A | 4/2006 |
| KR | 1020110062158 A | 6/2011 |
| KR | 1020120071311 A | 7/2012 |
| TW | 201529644 A | 8/2015 |

OTHER PUBLICATIONS

Communication dated Dec. 2, 2021 issued by the Taiwanese Patent Office in application No. 109126188.

Communication dated Aug. 31, 2021, from the Japanese Patent Office in Application No. 2020-131909.

Communication dated Jul. 28, 2021, from The China National Intellectual Property Administration in Application No. 202010771213.0.

Communication dated Feb. 8, 2022, issued by the China National Intellectual Property Administration in counterpart Chinese Application No. 202010771243.0.

Zongbo et al., "Research Progress in Perhydropolysilazane Coatings," Paint & Coating Industry, vol. 43, No. 4, Apr. 2014, total 6 pages.

Kim et al., "Characterization of Ammonium Silicate Residue during Polysilazane (PSZ) Dry Etching in $NF_3/H_2O$ Gas Chemistry," ECS Transactions, vol. 80, No. 2, pp. 211-219, 2017.

* cited by examiner

COMPOSITION FOR FORMING SILICA LAYER AND SILICA LAYER

CROSS-REFERENCE TO THE RELATED APPLICATION

This application is based on and claims priority from Korean Patent Application No. 10-2019-0102596 filed in the Korean Intellectual Property Office on Aug. 21, 2019, the disclosure of which is incorporated herein by reference in its entirety.

BACKGROUND

1. Field

This disclosure relates to a composition for forming a silica layer and a silica layer manufactured using the composition.

2. Description of the Related Art

In a flat panel display device, a thin film transistor (TFT) including a gate electrode, a source electrode, a drain electrode, and a semiconductor is used as a switching element. The flat panel display device includes a gate line for transmitting a scan signal for controlling the thin film transistor and a data line for transmitting a signal to be applied to a pixel electrode. In addition, an insulation layer for separating them is formed between the semiconductor and various electrodes.

The insulation layer commonly uses a silica layer formed by converting a silicon-containing polymer to silica. At this time, while the silicon-containing polymer is converted to a silica layer, gases such as hydrogen gas, ammonia gas, and silane gas may be generated, and voids may be generated inside the silica layer due to the generated gas, which may adversely affect a yield and reliability of a device. Therefore, minimizing the number of voids inside the silica layer is very important for improving a yield and reliability of a device, and research on the composition for forming the silica layer is continuously made in a direction of reducing the number of voids.

SUMMARY

An embodiment provides a composition for forming a silica layer capable of minimizing the number of voids inside the silica layer.

Another embodiment provides a silica layer manufactured from the composition for forming the silica layer.

Another embodiment provides an electronic device including the silica layer.

According to an embodiment, a composition for forming a silica layer includes a silicon-containing polymer and a solvent, wherein when adding 70 g of the composition for forming the silica layer to a 100 ml container, sealing the container, leaving the sealed container at a condition of a temperature of 40° C. for 28 days, and then taking a 1 ml sample of gas generated from the composition allowed to stand under the condition, the 1 ml sample of the gas includes hydrogen gas ($H_2$), silane gas ($SiH_4$), and ammonia gas ($NH_3$), and the amount of hydrogen gas, silane gas, and ammonia gas in the 1 ml sample satisfy the following Equation 1.

$$\text{(Hydrogen gas amount (ppm))/(silane gas amount (ppm)+ammonia gas amount (ppm))} \geq 1.5 \quad \text{[Equation 1]}$$

The hydrogen gas and ammonia gas may satisfy Equation 2.

$$\text{Ammonia gas amount (ppm)/hydrogen gas amount (ppm)} \leq 0.68 \quad \text{[Equation 2]}$$

The silicon-containing polymer may include a polysilazane, a polysiloxazane, or a combination thereof.

The polysilazane may be an inorganic polysilazane.

The silicon-containing polymer may have a weight average molecular weight of about 4,000 g/mol to about 13,000 g/mol.

The solvent may include at least one selected from benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethylcyclohexane, methylcyclohexane, cyclohexane, cyclohexene, p-menthane, dipropyl ether, dibutyl ether, anisole, butyl acetate, amyl acetate, methyl isobutyl ketone, or a combination thereof.

The silicon-containing polymer may be included in an amount of about 0.1 wt % to about 30 wt % based on a total amount of the composition for forming the silica layer.

According to another embodiment, a silica layer manufactured from the composition for forming the silica layer described above is provided.

According to another embodiment, an electronic device including the silica layer is provided.

When the composition for forming the silica layer according to an embodiment is used, a silica layer having minimized voids on the surface may be manufactured.

Additional features and/or advantages of the present disclosure are described further below. This summary section is meant merely to illustrate certain embodiments or features of the disclosure, and is not meant to limit the scope of the disclosure in any way. The failure to discuss a specific feature or embodiment of the disclosure, or the inclusion of one or more features in this summary section, should not be construed to limit the claims.

BRIEF DESCRIPTION OF THE DRAWINGS

The foregoing summary, as well as the following detailed description of certain embodiments of the application, will be better understood when read in conjunction with the appended drawings. It should be understood, however, that the disclosure is not limited to the precise arrangements and instrumentalities shown. In the drawings.

DETAILED DESCRIPTION

Figure 1:
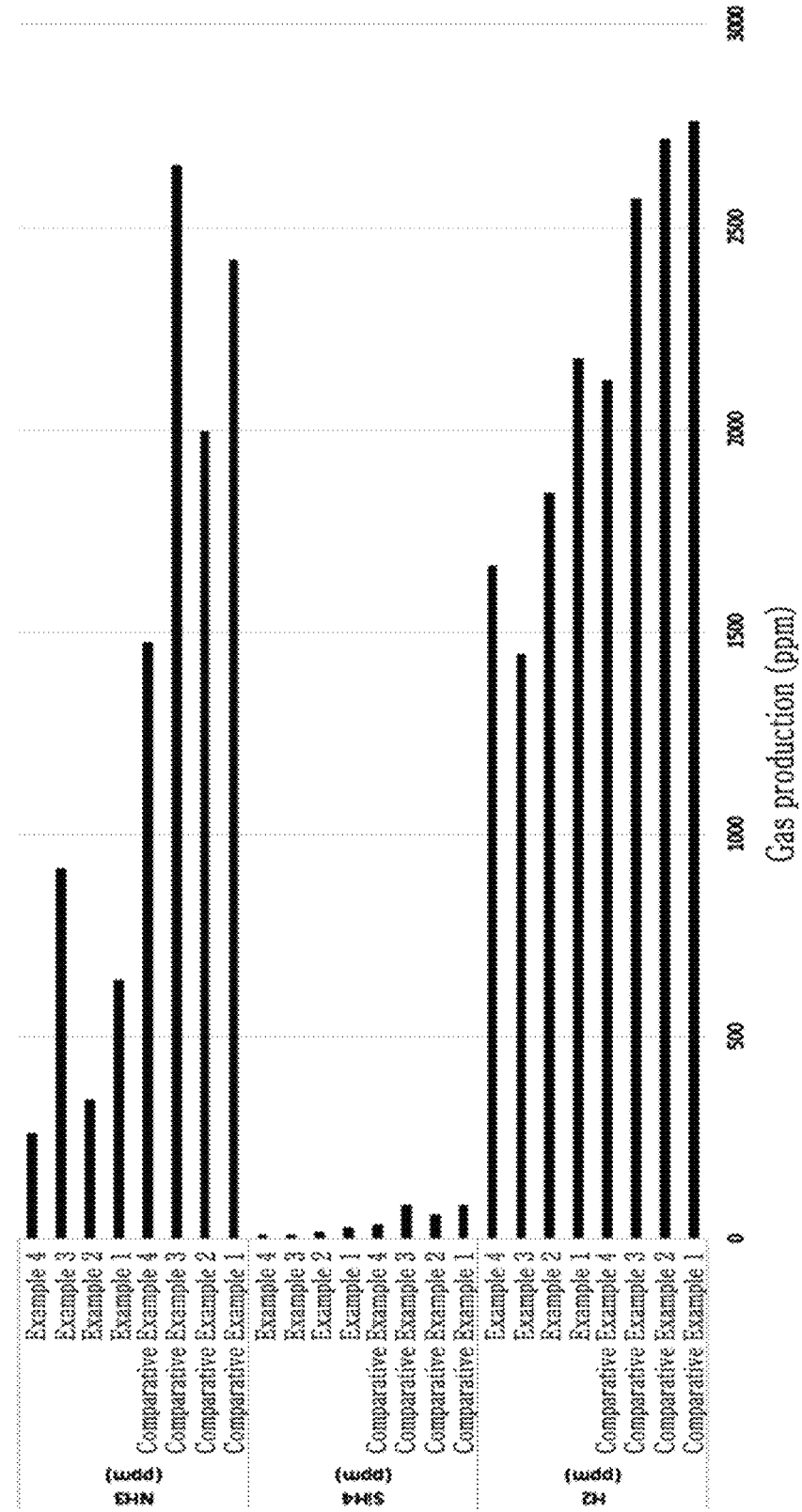
FIG. 1 is a graph showing contents of each of hydrogen gas, silane gas, and ammonia gas taken from the compositions for forming the silica layer according to examples and comparative examples.

Exemplary embodiments of the present disclosure will hereinafter be described in detail, and may be easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the present specification, the singular forms "a", "an", and "the" include plural references unless the context clearly dictates otherwise. Thus, for example, references to "a solvent" may include one or more different solvents.

Unless otherwise stated, each range disclosed herein will be understood to encompass and be a disclosure of each discrete point within the range and all possible subranges within the range.

As used herein, "about," "approximately," "substantially," and "significantly" will be understood by a person of ordinary skill in the art and will vary in some extent depending on the context in which they are used. If there are uses of the term which are not clear to persons of ordinary skill in the art given the context in which it is used, "about" and "approximately" will mean plus or minus <10% of particular term, and "substantially" and "significantly" will mean plus or minus >10% of the particular term. "Comprising" and "consisting essentially of" have their customary meaning in the art.

In the present specification, when a definition is not otherwise provided, "substituted" refers to replacement of hydrogen of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof. In addition, in the present specification, when a definition is not otherwise provided, "hetero" refers to one including 1 to 3 heteroatoms selected from N, O, S, and P.

In addition, as used herein, "*" means a portion linked with the same or different atoms or chemical formulas.

Hereinafter, a composition for forming a silica layer according to an embodiment of the present disclosure is described.

The composition for forming the silica layer according to an embodiment of the present disclosure includes a silicon-containing polymer and a solvent, wherein when adding 70 g of the composition for forming the silica layer to a 100 ml container, sealing the container, leaving the sealed container at a condition of a temperature of 40° C. for 28 days, taking a 1 ml sample of gas generated from the composition allowed to stand under the condition, and analyzing the 1 ml sample through a gas chromatography, the 1 ml sample of the gas includes hydrogen gas ($H_2$), silane gas ($SiH_4$), and ammonia gas ($NH_3$), and the hydrogen gas, silane gas, and ammonia gas satisfy the following Equation 1.

(Hydrogen gas amount (ppm))/(silane gas amount (ppm)+ammonia gas amount (ppm))≥1.5.   [Equation 1]

When the composition for forming a silica layer, which was allowed to stand under the condition, satisfies Equation 1, a silica layer formed thereof may be minimized from the number of voids generated on the surface.

Specifically, in order to include many chips inside a wafer having the same area and drive the semiconductor at a low voltage, a line width of an electronic device such as the semiconductor device and the like continuously tends to become micronized. Particularly, the line width micronization of a memory semiconductor represented by DRAM and NAND flash makes the yield and electrical reliability of the semiconductor device more important. In order to increase this yield and electrical reliability, there are needs for a silica layer material improved in terms of a void defect phenomenon after curing at a high temperature. Such a need is particularly required, for example, in a STI/ILD (Shallow Trench Isolation/Inner Layer Dielectric) insulation layer-manufacturing process. A silica layer material that is improved in terms of the void defect phenomenon may increase the margin of these types of processes and thus greatly improve performance and quality.

In general, a silica layer is formed by coating and curing a composition for a silica layer (the composition including a silicon-containing polymer and a solvent) in a predetermined region of a device. When the silicon-containing polymer of the composition is converted into the silica layer, gas such as $H_2$, $NH_3$, $SiH_4$, and the like is generated and directly causes the void defect phenomenon on the surface of the silica layer.

However, after putting 70 g of the composition for forming a silica layer in a 100 ml vessel, sealing the vessel, and leaving the sealed vessel at a temperature of 40° C. for 28 days (condition A), when 1 ml of gas generated from the composition (condition A) is taken and analyzed by gas chromatography, the gas generated under condition A may satisfy Equation 1 and, ultimately, greatly improve the void defect phenomenon on the surface of the silica layer.

In other words, the composition for a silica layer according to an embodiment exhibits the gas chromatography analysis result of the gas under the condition A satisfying Equation 1 ((hydrogen gas amount)/(silane gas amount+ammonia gas amount), which is greater than or equal to 1.5 (ppm), for example, greater than or equal to 1.55 (ppm)) and thus may form a layer having small void generation but satisfactory gap filling during the process. In addition, in the following curing process, a low etch-rate is maintained to reinforce physical/chemical characteristics.

The reason that the composition for forming a silica layer according to an embodiment satisfies Equation 1 under the condition A is regarded to be a structural difference of the silicon-containing polymer contained in the composition for a silica layer. It is thought that, because the structural difference of the silicon-containing polymer makes moisture permeated deep inside holes and increases a conversion amount of silica during the following curing at a high temperature, gas generated therein promotes degassing and decreases an etch rate of deep holes, which thereby provides a silica layer minimized from generation of voids.

The gas chromatography analysis result of the composition for a silica layer according to an embodiment under the condition A may satisfy Equation 1 by designing a structure of the silicon-containing polymer and thus result in minimizing the void generation on the layer surface.

For example, the gas chromatography analysis result under the condition A may also satisfy Equation 2 ((ammonia gas amount)/(hydrogen gas amount), which is less than or equal to 0.68, for example, less than or equal to 0.64 (based on ppm reference)), as well as Equation 1.

$$\text{Ammonia gas amount (ppm)/hydrogen gas amount (ppm)} \leq 0.68 \quad \text{[Equation 2]}$$

When the gas chromatography analysis result under the condition A simultaneously satisfies Equations 1 and 2, the number of voids on the surface is minimized, and performance of an electronic device including a silica layer formed of the composition for a silica layer according to an embodiment may be greatly improved.

For example, in the gas chromatography analysis result under the condition A, hydrogen gas may have an amount of less than 2500 ppm, silane gas may have an amount of less than 30 ppm, and ammonia gas may have an amount of less than 1000 ppm.

For example, the silicon-containing polymer may include polysilazane, polysiloxazane, or a combination thereof. For example, the silicon-containing polymer may have a weight average molecular weight of about 4,000 g/mol to about 20,000 g/mol, but is not limited thereto. When the weight average molecular weight of the silicon-containing polymer satisfies the ranges, the gas chromatography analysis result under the condition A may easily satisfy Equation 1.

The silicon-containing polymer may include, for example, a moiety (or repeating unit) represented by the following Chemical Formula 1.

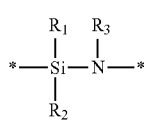
[Chemical Formula 1]

In Chemical Formula 1, $R_1$ to $R_3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

The weight ratio of the moiety according to formula (1) in the silicon-containing polymer may be about 5 wt % to about 100 wt %; about 15 wt % to about 85 wt %; about 25 wt % to about 75 wt %; about 35 wt % to 65%; about 45 wt % to about 55 wt %; or any wt % between about 5 wt % to about 100 wt %.

For example, the silicon-containing polymer may be a polysilazane, for example an inorganic polysilazane produced by a reaction of a halosilane and ammonia.

The silicon-containing polymer included in the composition for forming the silica layer may, for example, further include a moiety (or repeating unit) represented by the following Chemical Formula 2 in addition to the moiety represented by Chemical Formula 1.

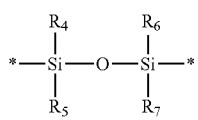
[Chemical Formula 2]

In Chemical Formula 2, $R_4$ to $R_7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstitutedalkoxy group, a carboxyl group, an aldehyde group, a hydroxy group, or a combination thereof, "*" refers to a linking point.

In this case, the silicon-containing polymer includes a silicon-oxygen-silicon (Si—O—Si) bond moiety (a siloxane functional group; a plurality of which may form a polysiloxane) in its structure in addition to a silicon-nitrogen (Si—N) bond moiety, and thereby the silicon-oxygen-silicon (Si—O—Si) bond moiety may lower any stress that is during curing by a heat treatment and reduce contraction.

The weight ratio of the moiety according to formula (2) in the silicon-containing polymer may be about 5 wt % to about 95 wt %; about 15 wt % to about 85 wt %; about 25 wt % to about 75 wt %; about 35 wt % to 65%; about 45 wt % to about 55 wt %; or any wt % between about 5 wt % to about 95 wt %.

In some embodiments, a weight ratio in the silicon-containing polymer of the moiety according to formula (1) relative to the weight ratio of the moiety according to formula (2) may be about 100:0; about 95:5; about 90:10; about 85:15; about 80:20; about 75:25; about 70:30; about 65:35; about 60:40; about 55:45; about 50:50; about 45:55; about 40:60; about 35:65; about 30:70; about 25:75; about 20:80; about 15:85; about 10:90; about 5:95; or any range between these values (e.g., a range of about 90:10 to about 55:35).

The silicon-containing polymer may include, for example, the moiety represented by Chemical Formula 1, the moiety represented by Chemical Formula 2, and further a moiety (silanide group) represented by the following Chemical Formula 3.

*SiH$_3$ [Chemical Formula 3]

The moiety represented by Chemical Formula 3 has a structure where the terminal end is capped with hydrogen, and may be included in an amount of about 15 to about 35 wt % based on a total amount of the Si—H bond of the polysilazane or polysiloxazane structure. When the moiety of Chemical Formula 3 is included in the polysilazane or polysiloxazane structure within the range, a SiH$_3$ moiety is prevented from being scattered into SiH$_4$ while an oxidation reaction sufficiently occurs during the heat treatment, and a crack in a filler pattern may be prevented.

The silicon-containing polymer may be included in an amount of about 0.1 wt % to about 50 wt %, for example about 0.1 wt % to about 30 wt % based on a total amount of the composition for forming a silica layer. When the silicon-containing polymer is included within the ranges, the silicon-containing polymer may maintain an appropriate viscosity and bring about flat and uniform layer with no void.

The solvent of the composition for forming the silica layer may be any solvent in which the silicon-containing polymer is soluble without limitation, and may include, for example, one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, or a combination thereof.

The composition for forming a silica layer may further include a thermal acid generator (TAG).

The thermal acid generator may be an additive to improve developing a property of the composition for forming a silica layer, and thus makes organosilane-based condensed polymers of the composition be developed at a relatively low temperature.

The thermal acid generator may include any compound without particular limit, if it generates acid ($H^+$) by heat. In particular, the thermal acid generator may include a compound activated at 90° C. or higher and generating sufficient acid and preferably also having low volatility.

The thermal acid generator may be, for example, selected from nitrobenzyl tosylate, nitrobenzyl benzenesulfonate, phenol sulfonate, or a combination thereof.

The thermal acid generator may be included in an amount of about 0.01 to about 25 wt % based on a total amount of the composition for forming a silica layer. Within the range, the condensed polymer may be developed at a low temperature and simultaneously, have improved coating properties.

The composition for forming the silica layer may further include a surfactant.

The surfactant is not particularly limited, and may be, for example, a non-ionic surfactant such as polyoxyethylene alkyl ethers such as polyoxyethylene lauryl ether, polyoxyethylene stearyl ether, polyoxyethylene cetyl ether, polyoxyethylene oleyl ether, and the like, polyoxyethylene alkylallyl ethers such as polyoxyethylenenonyl phenol ether, and the like, polyoxyethylenepolyoxypropylene block copolymers, polyoxyethylene sorbitan fatty acid ester such as sorbitan monolaurate, sorbitan monopalmitate, sorbitan monostearate, sorbitan monooleate, polyoxyethylene sorbitan monostearate, polyoxyethylene sorbitan trioleate, polyoxyethylene sorbitan tristearate, and the like, a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like, other silicone-based surfactant such as an organosiloxane polymer KP341 (Shin-Etsu Chemical Co., Ltd.), and the like.

The surfactant may be included in an amount of about 0.001 wt % to about 10 wt % based on the total amount of the composition for forming a silica layer. Within the range, dispersion of a solution and, simultaneously, uniform thickness of a layer may be improved.

The composition for forming a silica layer may be a solution obtained by dissolving the silicon-containing polymer and the components in the mixed solvent.

According to another embodiment of the present disclosure, a method for manufacturing a silica layer includes coating the aforementioned composition for forming the silica layer on a substrate; drying the substrate coated with the composition for forming a silica layer; and curing the resultant under an inert gas atmosphere of greater than or equal to about 150° C.

For example, the composition for forming a silica layer may be coated using a solution process such as a spin-on coating method, slit coating, or inkjet printing.

The substrate may be, for example, a device substrate such as a semiconductor, a liquid crystal and the like, but is not limited thereto.

According to another embodiment of the present disclosure, a silica layer includes a silica component obtained by converting the silicon-containing polymer for a silica layer.

The silica layer may be, for example an insulation layer, a separation layer, or a hard coating layer, but is not limited thereto.

The present disclosure provides an electronic device including the silica layer. The electronic device may be, for example a display device such as LCD or LED, or a semiconductor device.

The following examples illustrate embodiments of the present disclosure in more detail. However, these examples are exemplary, and the present disclosure is not limited thereto.

Preparation of Silicon-Containing Polymer

A weight average molecular weight of inorganic polysilazane in the present specification was measured by using GPC made by Waters Corp. (PLC Pump 1515), and a gas chromatography analysis was performed by using 7890A made by Agilent Technologies Inc. (Column; Restek, (10 ft×2 mm ID×⅛ in OD)).

Comparative Polymerization Example 1

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 37 g of ammonia was slowly injected thereinto over 4 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 μm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 μm Teflon filter. About 200 g of dry pyridine was added to the obtained inorganic polysilazane solution and polymerization was performed to provide a weight average molecular weight of 3100 g/mol at 100° C. and a solid content of 10%. When the polymerization was complete, the solid content was adjusted to have a solid concentration of 20% by 4 times repeatedly substituting the solvent with dibutylether using a rotary evaporator at 70° C. and the resultant was filtered with a 0.1 μm Teflon filter to obtain inorganic polysilazane.

Comparative Polymerization Example 2

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 37 g of ammonia was slowly injected thereinto over 4 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 μm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 μm Teflon filter. About 100 g of dry pyridine was added to the obtained inorganic polysilazane solution and polymerization was performed to provide a weight average molecular weight of 8300 g/mol at 100° C. and a solid content of 10%. When the polymerization was complete, the solid content was adjusted to have a solid concentration of 20% by 4 times repeatedly substituting the solvent with dibutylether using a rotary evaporator at 70° C. and the resultant was filtered with a 0.1 μm Teflon filter to obtain inorganic polysilazane.

The inorganic polysilazane was mixed with an amount of 3 wt % of tripentylamine having a number average molecular weight of less than 100,000, an amount of 3 wt % of trioctylamine having a number average molecular weight of less than 100,000, and an amount of 3 wt % of methylpiperidine having a number average molecular weight of less than 100,000 to obtain an amine-based inorganic polysilazane.

Comparative Polymerization Example 3

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 37 g of ammonia was slowly injected thereinto over 4 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 μm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 μm Teflon filter. About 100 g of dry pyridine was added to the obtained inorganic polysilazane solution and polymerization was performed to provide a weight average molecular weight of 15300 g/mol at 100° C. and a solid content of 10%. When the polymerization was complete, the solid content was adjusted to have a solid concentration of 20% by 4 times repeatedly substituting the solvent with dibutylether using a rotary evaporator at 70° C. and the resultant was filtered with a 0.1 μm Teflon filter to obtain inorganic polysilazane.

Comparative Polymerization Example 4

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 10 mol % of primary or secondary amine based on that of ammonia which would be described later was added thereto and then, aged for one hour. Then 37 g of ammonia was slowly injected thereinto over 4 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 μm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 μm Teflon filter. About 200 g of dry pyridine was added to the obtained inorganic polysilazane solution and polymerization was performed to provide a weight average molecular weight of 8400 g/mol at 100° C. and a solid content of 10%. When the polymerization was complete, the solid content was adjusted to have a solid concentration of 20% by 4 times repeatedly substituting the solvent with dibutylether using a rotary evaporator at 70° C. and the resultant was filtered with a 0.1 μm Teflon filter to obtain inorganic polysilazane.

Polymerization Example 1

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 37 g of ammonia was slowly injected thereinto over 8 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 μm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 μm Teflon filter. About 200 g of dry pyridine was added to the obtained inorganic polysilazane solution and polymerization was performed to provide a weight average molecular weight of 4100 g/mol at 100° C. and a solid content of 10%. When the polymerization was complete, the solid content was adjusted to have a solid concentration of 20% by 4 times repeatedly substituting the solvent with dibutylether using a rotary evaporator at 70° C. and the resultant was filtered with a 0.1 μm Teflon filter to obtain inorganic polysilazane.

Polymerization Example 2

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 37 g of ammonia was slowly injected thereinto over 8 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 μm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 µm Teflon filter. About 200 g of dry pyridine was added to the obtained inorganic polysilazane solution and polymerization was performed to provide a weight average molecular weight of 12500 g/mol at 100° C. and a solid content of 10%. When the polymerization was complete, the solid content was adjusted to have a solid concentration of 20% by 4 times repeatedly substituting the solvent with dibutylether using a rotary evaporator at 70° C. and the resultant was filtered with a 0.1 µm Teflon filter to obtain inorganic polysilazane.

Polymerization Example 3

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 37 g of ammonia was slowly injected thereinto over 8 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 µm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 µm Teflon filter. About 200 g of dry pyridine was added to the obtained inorganic polysilazane solution and polymerization was performed to provide a weight average molecular weight of 8600 g/mol at 100° C. and a solid content of 13%. When the polymerization was complete, the solid content was adjusted to have a solid concentration of 20% by 4 times repeatedly substituting the solvent with dibutylether using a rotary evaporator at 70° C. and the resultant was filtered with a 0.1 µm Teflon filter to obtain inorganic polysilazane.

Polymerization Example 4

A 1 L reactor equipped with a stirrer and a temperature controller was internally exchanged with dry nitrogen. Subsequently, 800 g of dry pyridine was injected into the reactor, and the reactor was cooled down to −1° C. Then, 60 g of dichlorosilane was injected thereinto at a speed of 200 sccm over 65 minutes. The obtained mixture was aged for one hour, while stirred, and 37 g of ammonia was slowly injected thereinto over 8 hours at a speed of 200 sccm. The obtained mixture was aged for 2 hours, while stirred. Then, dry nitrogen was injected into the reactor for 12 hours to remove the ammonia remaining in the reactor. The obtained white slurry product was filtered with a 0.1 µm Teflon filter under a dry nitrogen atmosphere to obtain 680 g of a filtered solution. Subsequently, 800 g of dry xylene was added thereto, and a solid therein was adjusted to have a solid concentration of 20% by three times repeatedly substituting the pyridine with xylene using a rotary evaporator and the resultant was filtered with a 0.1 µm Teflon filter. About 200 g of dry pyridine was added to the obtained inorganic polysilazane solution and polymerization was performed to provide a weight average molecular weight of 8900 g/mol at 100° C. and a solid content of 10%. When the polymerization was complete, the solid content was adjusted to have a solid concentration of 20% by 4 times repeatedly substituting the solvent with dibutylether using a rotary evaporator at 70° C. and the resultant was filtered with a 0.1 µm Teflon filter to obtain inorganic polysilazane.

The inorganic polysilazane was mixed with 0.5 mol % of n,n-dimethylethanolamine based on a total amount of the inorganic polysilazane to obtain inorganic polysilazane.

GC Analysis of Silicon-Containing Polymer

The silicon-containing polymers according to Comparative Polymerization Examples 1 to 4 and Polymerization Examples 1 to 4 were respectively added to a dibutylether (DBE) solvent to prepare each sample having a solid content of 18±1 wt %. Subsequently, the samples were respectively taken by 70 g, divided into small amounts in 100 ml septum glass bottles, the bottles were sealed with septum cap and then, left at 40° C. for 28 days (4 weeks). Then, a syringe was used for sampling 1 ml of gas from the top of the septum glass bottles, and a GC (gas chromatography) analysis thereof was performed.

The results are shown in Table 1 and FIG. 1.

TABLE 1

| | Molecular weight (g/mol) | $H_2$ (ppm) | $SiH_4$ (ppm) | $NH_3$ (ppm) | $H_2/(SiH_4 + NH_3)$ | $NH_3/H_2$ |
|---|---|---|---|---|---|---|
| Comparative Polymerization Example 1 | 3100 | 2760 | 83 | 2419 | 1.10 | 0.87 |
| Comparative Polymerization Example 2 | 8300 | 2715 | 60 | 1992 | 1.32 | 0.73 |
| Comparative Polymerization Example 3 | 15300 | 2570 | 85 | 2653 | 0.93 | 1.03 |
| Comparative Polymerization Example 4 | 8400 | 2120 | 35 | 1473 | 1.40 | 0.69 |
| Polymerization Example 1 | 4100 | 2172 | 26 | 637 | 3.27 | 0.29 |
| Polymerization Example 2 | 12500 | 1841 | 16 | 344 | 5.11 | 0.18 |
| Polymerization Example 3 | 8600 | 1443 | 9 | 913 | 1.56 | 0.63 |
| Polymerization Example 4 | 8900 | 1663 | 9 | 260 | 6.18 | 0.15 |

Referring to Table 1 and FIG. 1, the silicon-containing polymer according to Polymerization Examples 1 to 4 exhibited (hydrogen gas amount)/(silane gas amount+ammonia gas amount) of greater than or equal to 1.5, specifically, greater than or equal to 1.55, (ammonia gas amount/ hydrogen gas amount) of less than or equal to 0.68, specifically, less than or equal to 0.64, and a weight average molecular weight of 4000 to 13000 g/mol. In other words, the silicon-containing polymer according to Polymerization Examples 1 to 4 satisfied Equation 1 and also satisfied Equation 2. In contrast, each of the silicon-containing polymers according to Comparative Polymerization Examples 1 to 4 failed to satisfy Equation 1, and each of the silicon-containing polymers according to Comparative Polymerization Examples 1 to 4 failed to satisfy Equation 2.

Preparation of Composition for Forming Silica Layer

Examples 1 to 4 and Comparative Examples 1 to 4

The silicon-containing polymers according to Polymerization Examples 1 to 4 and Comparative Polymerization Examples 1 to 4 were respectively adjusted to have a solid concentration of 15% by four times repeating substitution of the solvents with dibutylether by using a Rotary evaporator at 70° C. and the resultant was filtered with a 0.1 μm Teflon filter to obtain compositions for forming a silica layer according to Examples 1 to 4 and Comparative Examples 1 to 4.

Evaluation of Void on Surface of Layer

The compositions for forming the silica layer according to Examples 1 to 4 and Comparative Examples 1 to 4 were respectively taken by 3 cc, dispensed in the center of an 8-inch silicon wafer with a spin-coater (MS-A200, MIKASA Co., Ltd.), and spin-coated at 1500 rpm for 20 seconds. Subsequently, the costed wafers were heated and dried at 150° C. for 3 minutes on a hot plate and then, wet-cured at 600° C. for 30 minutes to form silica layers. Subsequently, the silica layers were respectively dipped in 1 wt % DHF (diluted hydrofluoric acid) for 120 seconds, and cross-sections of the layers were examined through V-SEM images.

Figure 2:
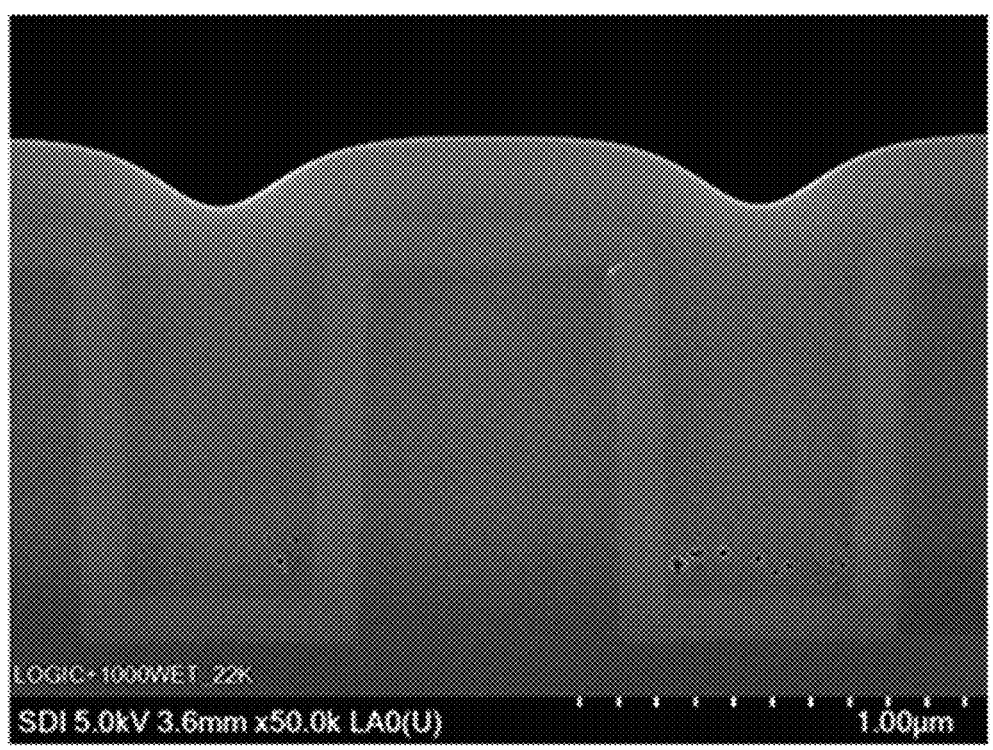
FIG. 2 is a V-SEM image of the surface of the layer formed from the composition for forming the silica layer according to Example 1.
Figure 3:
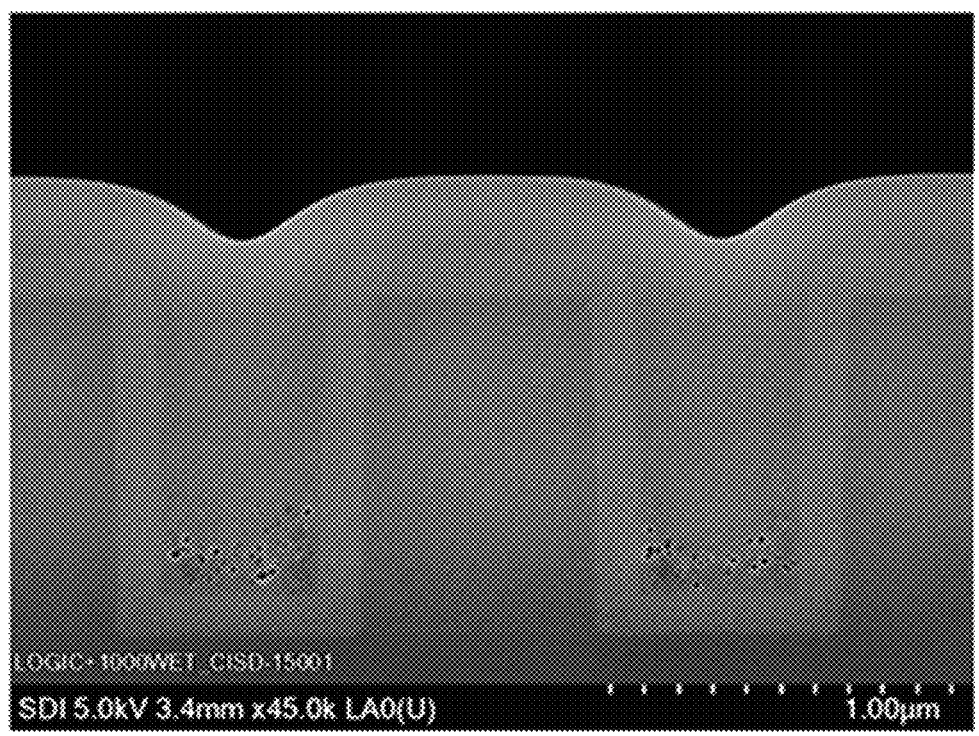
FIG. 3 is a V-SEM image of the surface of the layer formed from the composition for forming the silica layer according to Comparative Example 1.

FIG. 2 is a V-SEM image of the surface of the layer formed from the composition for forming the silica layer according to Example 1, and FIG. 3 is a V-SEM image of the surface of the layer formed from the composition for forming the silica layer according to Comparative Example 1.

Referring to FIGS. 2 and 3, the layers formed from the compositions for forming the silica layer according to examples exhibited a relatively small number of voids on the surface of the layer after a wet etching process, compared with a layer formed from the compositions for forming the silica layer according to comparative examples.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A composition for forming a silica layer, the composition comprising:
   a silicon-containing polymer; and
   a solvent,
   wherein the silicon-containing polymer is an inorganic polysilazane,
   wherein the inorganic polysilazane has a weight average molecular weight of 8,600 g/mol to 13,000 g/mol;
   wherein the solvent is at least one selected from the group consisting of benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethylcyclohexane, methylcyclohexane, cyclohexane, cyclohexene, p-menthane, dipropyl ether, dibutyl ether, anisole, butyl acetate, amyl acetate, methyl isobutyl ketone, and a combination thereof, and
   when adding 70 g of the composition to a 100 ml container, sealing the container, leaving the sealed container at 40° C. for 28 days, and then taking a 1 ml sample of gas from the sealed container, the 1 ml sample of the gas comprises hydrogen gas ($H_2$), silane gas ($SiH_4$), and ammonia gas ($NH_3$), and the hydrogen gas, the silane gas, and the ammonia gas satisfy Equation 1:

(hydrogen gas amount (ppm))/(silane gas amount (ppm)+ammonia gas amount (ppm))≥1.5    [Equation 1].

2. The composition of claim 1, wherein the silane gas and the ammonia gas satisfy Equation 2:

ammonia gas amount (ppm)/hydrogen gas amount (ppm)≤0.68    [Equation 2].

3. The composition of claim 1, wherein the inorganic polysilazane is included in an amount of 0.1 wt % to 30 wt % based on a total amount of the composition for forming the silica layer.

4. The composition of claim 1, wherein the inorganic polysilazane includes a plurality of silazane repeating units and a plurality of siloxane repeating units.

5. The composition of claim 4, wherein the inorganic polysilazane further includes a plurality of silanide groups.

6. The composition of claim 1, wherein the inorganic polysilazane includes a plurality of repeating units represented by the following Formula (1):

wherein, in Formula (1), $R_1$ to $R_3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

7. The compound of claim 6, wherein a weight ratio of the repeating unit according to Formula (1) in the inorganic polysilazane is 5 wt % to 100 wt %.

8. The composition of claim 6, wherein the inorganic polysilazane further includes a plurality of repeating units represented by the following Formula (2):

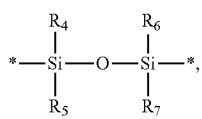
(2)

wherein, in Formula (2), $R_4$ to $R_7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

9. The compound of claim 8, wherein a weight ratio of the repeating unit according to Formula (2) in the inorganic polysilazane is 5 wt % to 95 wt %.

10. The composition according to claim 8, wherein a ratio of an amount by weight of the repeating units according to Formula (1) to an amount by weight of the repeating units according to Formula (2) is from 95:5 to 5:95.

11. The composition of claim 8, wherein the inorganic polysilazane further includes a plurality of silanide groups.

12. The composition of claim 6, wherein the inorganic polysilazane further includes a plurality of silanide groups.

13. The composition of claim 1, wherein the solvent is xylene.

14. The composition of claim 1, wherein the inorganic polysilazane is produced by a process comprising: injecting ammonia to a mixture of pyridine and dichlosilane contained in a reactor over 8 hours.

15. A silica layer manufactured from the composition of claim 1.

16. An electronic device comprising the silica layer of claim 15.

* * * * *